(12) United States Patent
Jun

(10) Patent No.: US 9,281,267 B1
(45) Date of Patent: Mar. 8, 2016

(54) SEMICONDUCTOR PACKAGE HAVING OVERHANG PORTION

(71) Applicant: SK hynix Inc., Icheon-si Gyeonggi-do (KR)

(72) Inventor: Yong Tae Jun, Cheongju-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/549,704

(22) Filed: Nov. 21, 2014

(30) Foreign Application Priority Data

Aug. 21, 2014 (KR) .......................... 10-2014-0108716

(51) Int. Cl.
*H01L 23/52* (2006.01)
*H01L 23/49* (2006.01)
*H01L 23/498* (2006.01)
*H01L 23/00* (2006.01)

(52) U.S. Cl.
CPC ........ *H01L 23/498* (2013.01); *H01L 23/49861* (2013.01); *H01L 24/09* (2013.01); *H01L 24/32* (2013.01); *H01L 24/49* (2013.01); *H01L 2924/1011* (2013.01)

(58) Field of Classification Search
CPC ........... H01L 2924/00014; H01L 2224/48247; H01L 2224/97; H01L 2224/73215; H01L 2224/73265; H01L 24/48; H01L 2924/14; H01L 2221/6834; H01L 24/49; H01L 21/56; H01L 2224/03; H01L 2224/85; H01L 2224/96; H01L 24/45; H01L 21/563; H01L 2224/04105; H01L 2224/80; H01L 2224/8385; H01L 23/49861

USPC .......................................... 257/784, 685, 691
See application file for complete search history.

(56) References Cited

U.S. PATENT DOCUMENTS

| 5,710,457 A * | 1/1998 | Uno .................. H01L 23/49506 257/666 |
| 2005/0090050 A1* | 4/2005 | Shim .................... H01L 25/0657 438/200 |
| 2010/0052130 A1* | 3/2010 | Hwang .................. H01L 23/13 257/685 |

FOREIGN PATENT DOCUMENTS

| KR | 1020090056561 A | 6/2009 |
| KR | 1020100002868 A | 1/2010 |

* cited by examiner

*Primary Examiner* — Caleen Sullivan
(74) *Attorney, Agent, or Firm* — William Park & Associates Ltd.

(57) ABSTRACT

A semiconductor package may include a substrate, and a structural body disposed over the substrate. The semiconductor package may include a semiconductor chip stacked over the structural body, and having an overhang portion projecting over a side surface of the structural body and overhanging out over the side surface of the structural body. The semiconductor package may include one or more bonding pads disposed on the overhang portion, and one or more wires electrically coupling the bonding pads to the substrate. The semiconductor package may include a wire fixing film attached onto the structural body, and overhanging out over the side surface of the structural body to fix the one or more wires.

21 Claims, 7 Drawing Sheets

US 9,281,267 B1

SEMICONDUCTOR PACKAGE HAVING OVERHANG PORTION

CROSS-REFERENCE TO RELATED APPLICATION

The present application claims priority under 35 U.S.C. 119(a) to Korean patent application number 10-2014-108716 filed in the Korean Intellectual Property Office on Aug. 21, 2014, which is incorporated herein by reference in its entirety.

BACKGROUND

1. Technical Field

Various embodiments generally relate to a semiconductor technology, and more particularly, to a semiconductor package having an overhang portion.

2. Related Art

The electronic industry may trends toward manufacturing products at reduced costs while attempting to maintain a high reliability while trying to maintain or accomplish light weight, miniaturization, high speed operations, multi-functionality and high performances. The package assembly technology is one of the important technologies considered in designing such products.

The package assembly technology may deal with protecting the assembly from outside circumstances. The package assembly technology may include the use of a semiconductor chip having integrated circuits formed therein and may relate to easily mounting the semiconductor chip to a substrate so that operational reliability of the semiconductor chip can be secured. With regards to the package assembly technology, one of the schemes for electrically coupling a semiconductor chip and a substrate includes a wire bonding scheme. The wire bonding scheme electrically couples the semiconductor chip and the substrate with each other using wires.

SUMMARY

In an embodiment, a semiconductor package may include a substrate, and a structural body disposed over the substrate. The semiconductor package may include a semiconductor chip stacked over the structural body, and having an overhang portion projecting over a side surface of the structural body and overhanging out over the side surface of the structural body. The semiconductor package may include one or more bonding pads disposed on the overhang portion, and one or more wires electrically coupling the bonding pads to the substrate. The semiconductor package may include a wire fixing film attached onto the structural body, and overhanging out over the side surface of the structural body to fix the one or more wires.

In an embodiment, a semiconductor package may include a substrate, and a structural body disposed over the substrate. The semiconductor package may include a semiconductor chip having a plurality of bonding pads, and stacked over the structural body such that one end portion of the semiconductor chip having one or more bonding pads projects over a side surface of the structural body and overhangs from the side surface of the structural body. The semiconductor package may include a wire fixing film attached onto the structural body such that one end portion of the wire fixing film projects over the side surface of the structural body and overhangs from the side surface of the structural body. The semiconductor package may include wires electrically coupling the bonding pads and the substrate across the wire fixing film, and fixed to the wire fixing film.

DETAILED DESCRIPTION

Hereinafter, a semiconductor package having an overhang portion will be described below with reference to the accompanying drawings through various examples of embodiments.

Figure 1:
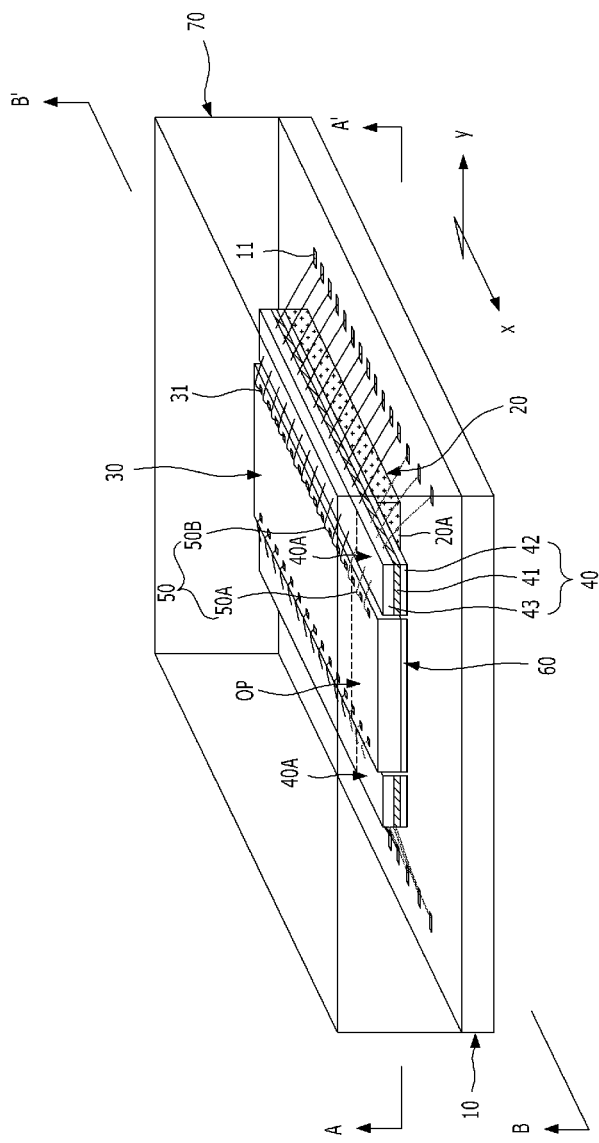
FIG. 1 is a perspective view illustrating a representation of an example of a semiconductor package in accordance with an embodiment.
Figure 2:
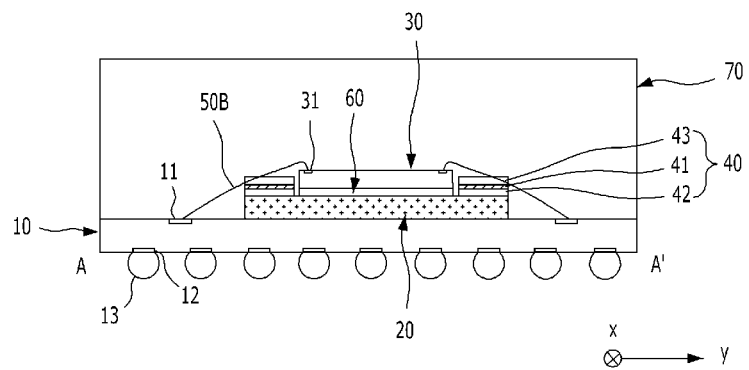
FIG. 2 is a cross-sectional representation of a view taken along the line A-A' of FIG. 1.
Figure 3:
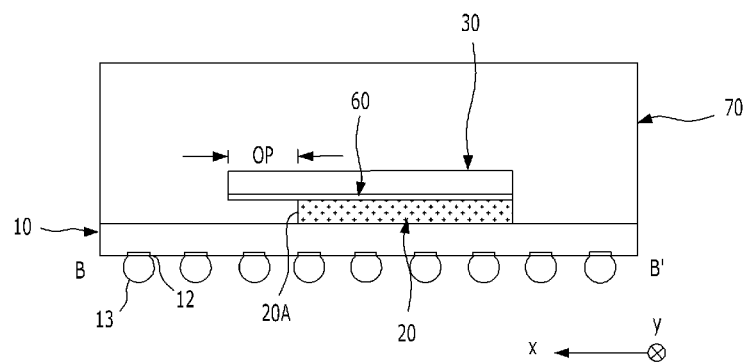
FIG. 3 is a cross-sectional representation of a view taken along the line B-B' of FIG. 1.

Referring to FIGS. 1 to 3, a semiconductor package in accordance with an embodiment may include a substrate 10, a structural body 20, and a semiconductor chip 30. The semiconductor package may include a wire fixing film 40, and wires 50.

The substrate 10 may be a printed circuit board (PCB).

A plurality of coupling pads 11 may be formed on the top surface of the substrate 10. In an embodiment, the coupling pads 11 may be disposed adjacent to and along the opposite edges of the top surface of the substrate 10 in the direction of the x-axis as illustrated in FIG. 1. A plurality of electrode pads 12 may be formed on the bottom surface of the substrate 10. External coupling electrodes 13 such as, for example but not limited to, solder balls may be formed on the electrode pads 12. While not illustrated, the substrate 10 may include circuit wiring lines (not illustrated) which electrically couple the coupling pads 11 formed on the top surface with the electrode pads 12 formed on the bottom surface. The substrate 10 may be configured by any one of, for example but not limited to, a lead frame, a flexible substrate and an interposer.

The structural body 20 may be disposed on the substrate 10.

The structural body 20 may include at least any one of an insulator such as, for example but not limited to, a solder resist film, a semiconductor chip, and a dummy chip. In an embodiment illustrated in FIGS. 1 to 3, it is illustrated that the structural body 20 is constructed by a solder resist film.

While not illustrated, in the example where the structural body 20 is a semiconductor chip, the semiconductor chip may be electrically coupled with the substrate 10. In order for electrical coupling with the substrate 10, the semiconductor chip may have a plurality of bumps on the front surface thereof on which bonding pads are disposed, and may be flip chip-bonded onto the substrate 10 by the medium of the bumps. The semiconductor chip may be attached onto the substrate 10 by the medium of an adhesive member, and may be electrically coupled with the substrate 10 by the medium of wires. In the examples where the structural body 20 is a dummy chip, the dummy chip may be attached onto the substrate 10 by the medium of an adhesive member.

The semiconductor chip 30 may have a front surface, a back surface facing away from the front surface, and side surfaces connecting the front surface with the back surface.

A plurality of bonding pads 31 may be formed on the front surface of the semiconductor chip 30. The bonding pads 31 serving as the electrical contacts of a circuit unit (not illustrated) for electrical coupling with an external circuit or device may be formed adjacent to and along the opposite edges of the front surface of the semiconductor chip 30. That is to say, the semiconductor chip 30 may have an edge pad type structure. Although not illustrated, the bonding pads 31 may be formed on and along the center portion of the front surface of the semiconductor chip 30. That is to say, the semiconductor chip 30 may have a center pad type structure.

The circuit unit may include a semiconductor memory device or/and a semiconductor logic device. The circuit unit may be an integrated circuit in which individual devices such as, for example but not limited to, a transistor, a resistor, a capacitor, a fuse and so forth necessary for the operation of a chip are electrically coupled with one another.

An adhesive member 60 may be attached to the back surface of the semiconductor chip 30. The semiconductor chip 30 may be attached onto the structural body 20 by the medium of the adhesive member 60.

The semiconductor chip 30 may be attached onto the structural body 20 in such a manner that one end portion of the semiconductor chip 30 which includes one or more bonding pads 31 projects over a side surface 20A of the structural body 20 in the direction of the x-axis. The semiconductor chip 30 may have an overhang portion OP projecting over the side surface 20A of the structural body 20, and one or more bonding pads 31 may be disposed on the overhang portion OP. The overhang portion OP of the semiconductor chip may project over the side surface 20A and overhang from the side surface 20A of the structural body 20 or overhang out over the side surface 20A of the structural body 20.

The wire fixing film 40 may be attached onto the structural body 20. Namely, the semiconductor chip 30 and the wire fixing film 40 may be horizontally disposed or substantially horizontally disposed on the structural body 20.

The wire fixing film 40 may be used to fix the wires 50. The wires 50 may be used for electrically coupling the bonding pads 31 of the semiconductor chip 30 with the coupling pads 11 of the substrate 10, and may be disposed between the bonding pads 31 of the semiconductor chip 30 and the coupling pads 11 of the substrate 10. The wire fixing film may be disposed between the bonding pads 31 of the semiconductor chip 30 and the coupling pads 11 of the substrate 10, and may be used to fix the wires 50 between the bonding pads 31 and the coupling pads 11. In an embodiment, the wire fixing film 40 may be disposed on both sides of the semiconductor chip 30 along the opposite edges of the semiconductor chip 30 adjacent to which the bonding pads 31 are positioned. One end portion 40A of the wire fixing film 40 may project over the side surface 20A of the structural body 20 in the direction of the x-axis, in correspondence to the overhang portion OP of the semiconductor chip 30. That is to say, the one end portion 40A of the wire fixing film 40 may not be supported by the structural body 20, but may overhang.

The wire fixing film 40 may include a support layer 41, an adhesive layer 42, and a fixing layer 43.

The support layer 41 may be formed by a material with a substantially high hardness. For example, the support layer 41 may be formed of polyimide. By the presence of the support layer 41 having the substantially high hardness, the one end portion 40A of the wire fixing film 40, which is not supported by the structural body 20 and overhangs, may be prevented from bending downward by its own weight. Accordingly, the support layer 41 may prevent the one end portion 40A from bending downward due to the weight of the one end portion 40A.

The adhesive layer 42 may be formed on the bottom surface of the support layer 41. The adhesive layer 42 may attach the support layer 41 and the structural body 20 to each other.

The fixing layer 43 may be formed on the top surface of the support layer 41. The fixing layer 43 may be formed of a material capable of permitting penetration of wires and/or capable of thermosetting. For example, the fixing layer 43 may be constructed by a thermosetting adhesive member such as, for example but not limited to, a PST (a penetrate spacer tape). The adhesive layer 42 may also be constructed by a thermosetting adhesive member such as, for example but not limited to, a PST, similarly to the fixing layer 43.

The wires 50 may be electrically coupled between the bonding pads 31 of the semiconductor chip 30 and the coupling pads 11 of the substrate 10. The wires 50 may electrically couple the semiconductor chip 30 and the substrate 10 with each other. The wires 50 may extend across the wire fixing film 40, and portions of the respective wires 50 may be fixed by being buried into the fixing layer 43 of the wire fixing film 40. In particular, overhanged wires 50A among the wires 50, which are electrically coupled with the bonding pads 31 disposed on the overhang portion OP of the semiconductor chip 30, may extend across the one end portion 40A of the wire fixing film 40 which projects, and portions of the respective overhanged wires 50A may be fixed by being buried into the fixing layer 43 of the one end portion 40A of the wire fixing film 40. Although the one end portion 40A of the wire fixing film 40 is not supported by the underlying structural body 20 and overhangs, since the support layer 41 of the wire fixing film 40 has the substantially high hardness, the one end portion 40A of the wire fixing film 40 may fix the overhanged wires 50A without bending downward. Also, because the support layer 41 of the wire fixing film 40 has the substantially high hardness, the one end portion 40A of the wire fixing film 40 may fix the wires 50 without bending towards the substrate 10. In FIGS. 1 and 2, reference numeral 50B represents wires which are electrically coupled with the bonding pads 31 disposed on the un-overhang portion of the semiconductor chip 30.

Since the wires 50 may not penetrate the support layer 41 which has the substantially high hardness, it is possible to prevent the occurrence of a phenomenon in which the wires 50 penetrate the bottom surface of the wire fixing film 40 and come into contact with the underlying structural body 20. The wires 50 may be formed of a metallic material, and may include at least any one of, for example but not limited to, gold, silver and copper. A molding part 70 may be formed on the top surface of the substrate 10 in such a way as to mold or substantially mold the structural body 20, the semiconductor chip 30, the wire fixing film 40 and the wires 50. The molding part 70 may be implemented to protect the semiconductor chip 30 from external circumstances, and may include an epoxy molding compound.

While it is illustrated in the embodiments described above with reference to FIGS. 1 to 3 that the wire fixing film 40 is horizontally disposed with respect to the semiconductor chip 30 on both sides of the semiconductor chip 30, it is to be noted that the embodiments are not limited to such and modification may be made in a variety of ways. Modified embodiments will become apparent from the following descriptions when taken in conjunction with reference to FIGS. 4 to 7.

Figure 4:
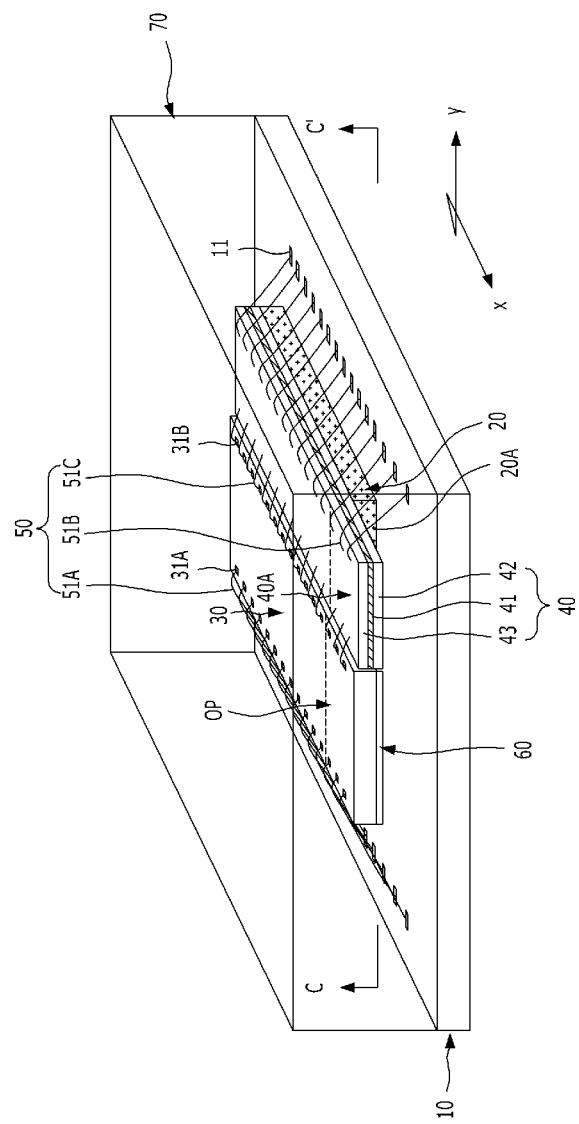
FIG. 4 is a perspective view illustrating a representation of an example of a semiconductor package in accordance with an embodiment.
Figure 5:
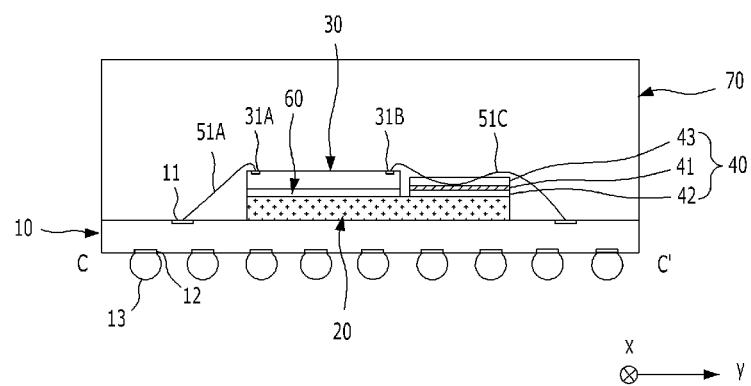
FIG. 5 is a cross-sectional representation of a view taken along the line C-C' of FIG. 4.

Referring to FIGS. 4 and 5, the wire fixing film 40 may not be disposed on both sides of the semiconductor chip 30. The wire fixing film 40 may be disposed on only one side of the semiconductor chip 30.

The semiconductor chip 30 may be disposed eccentrically on one side when viewed from the center line of the structural body 20, and the wire fixing film 40 may be disposed on the other side to be opposite to the semiconductor chip 30.

Bonding pads 31A disposed adjacent to and along one edge of the semiconductor chip 30 may be electrically coupled with the coupling pads 11 of the substrate 10 through first wires 51A among the wires 50. Bonding pads 31B disposed adjacent to and along the other edge of the semiconductor chip 30 which is opposite to the one edge may be electrically coupled with the coupling pads 11 of the substrate 10 through second wires 51B and 51C among the wires 50. The second wires 51B and 51C may extend across the wire fixing film 40, and portions of the respective second wires 51B and 51C may be fixed by being buried into the fixing layer 43 of the wire fixing film 40. Overhanged second wires 51B among the second wires 51B and 51C, which are electrically coupled with the bonding pads 31B disposed on the overhang portion OP of the semiconductor chip 30, may extend across the one end portion 40A of the wire fixing film 40 which projects, and portions of the respective overhanged second wires 51B may be fixed by being buried into the fixing layer 43 of the one end portion 40A of the wire fixing film 40. Although the one end portion 40A of the wire fixing film 40 is not supported by the underlying structural body 20 and overhangs, since the support layer 41 of the wire fixing film 40 has the substantially high hardness, the one end portion 40A of the wire fixing film 40 may fix the overhanged second wires 51B without bending downward. Also, because the support layer 41 of the wire fixing film 40 has the substantially high hardness, the one end portion 40A of the wire fixing film 40 may fix the overhanged second wires 51B without bending towards the substrate 10.

Figure 6:
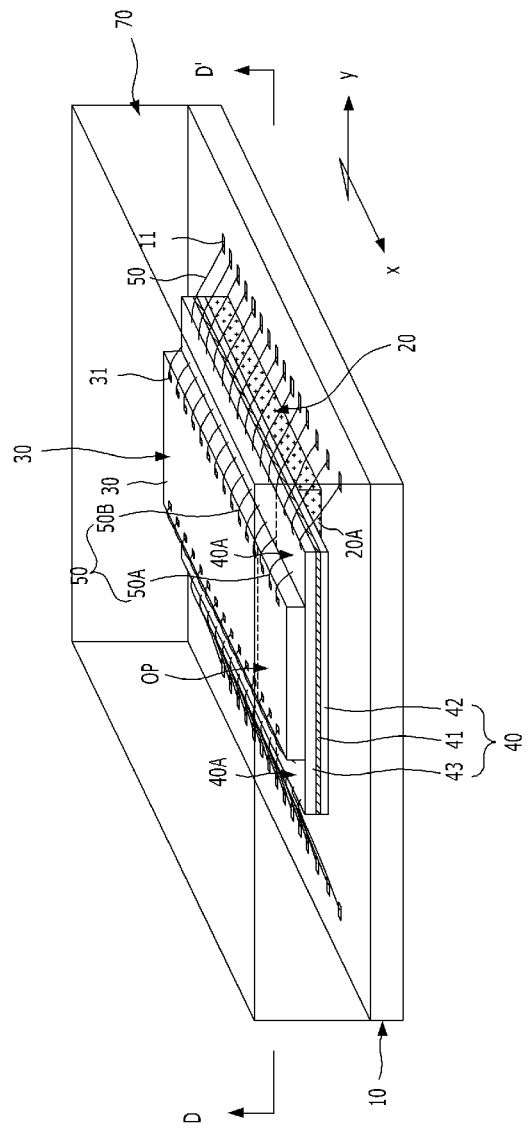
FIG. 6 is a perspective view illustrating a representation of an example of a semiconductor package in accordance with an embodiment.
Figure 7:
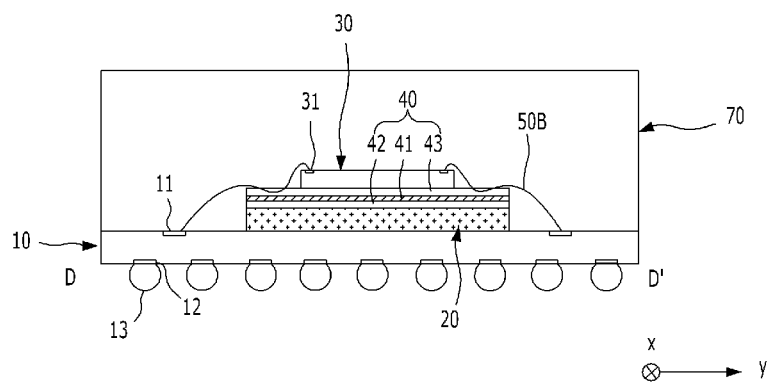
FIG. 7 is a cross-sectional representation of a view taken along the line D-D' of FIG. 6.

Referring to FIGS. 6 and 7, the wire fixing film 40 may not be disposed horizontally with respect to the semiconductor chip 30, and may be formed to extend between the top surface of the structural body 20 and the bottom surface of the semiconductor chip 30 and attach the structural body 20 and the semiconductor chip 30 to each other.

The wire fixing film 40 may be attached onto the structural body 20 in such a manner that one end portion 40A of the wire fixing film 40 projects over the side surface 20A of the structural body 20 in the direction of the x-axis defined in FIG. 6. The one end portion 40A may overhang from the side surface 20A of structural body 20 and substantially protrude out in substantially the direction of the x-axis. Further, the semiconductor chip 30 may be attached onto the wire fixing film 40 in such a manner that one end portion of the semiconductor chip 30 which includes one or more bonding pads 31 projects out or over the side surface 20A of the structural body 20 in the direction of the x-axis. The semiconductor chip 30 may overhang from the side surface 20A of the structural body 20 and protrude out in substantially the direction of the x-axis.

The wire fixing film 40 may include a support layer 41, an adhesive layer 42 formed on the bottom surface of the support layer 41, and a fixing layer 43 formed on the top surface of the support layer 41. The adhesive layer 42 and the fixing layer 43 may be constructed by thermosetting adhesive members.

The adhesive layer 42 of the wire fixing film 40 may be attached onto the top surface of the structural body 20, and the bottom surface of the semiconductor chip 30 may be attached onto the fixing layer 43 of the wire fixing film 40.

In an embodiment, since the semiconductor chip 30 and the structural body 20 are attached by the medium of the wire fixing film 40, a separate adhesive member may not be needed to attach the semiconductor chip 30 and the structural body 20.

Figure 8:
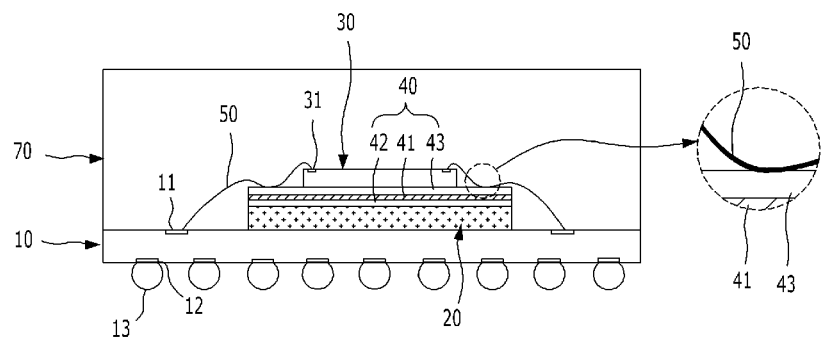
FIG. 8 is a cross-sectional view illustrating a representation of an example of a semiconductor package in accordance with an embodiment.

Although it is illustrated in the embodiments described above with reference to FIGS. 1 to 7 that portions of the respective wires 50A, 50B, 51B and 51C are buried into the fixing layer 43, it is to be noted that, as illustrated in FIG. 8, respective wires 50 may be formed in such a manner that portions of the wires 50 are seated on the top surface of the fixing layer 43.

According to the embodiments, by fixing wires to be electrically coupled with bonding pads which are disposed on an overhang portion of a semiconductor chip, the wires may be prevented from sweeping. As a consequence, since it may be possible to prevent the occurrence of a short circuit between the wires attributable to the contact of wires with adjacent wires due to wire sweeping, electrical reliability may be improved.

The above-described semiconductor packages may be applied to various semiconductor devices and package modules.

Figure 9:
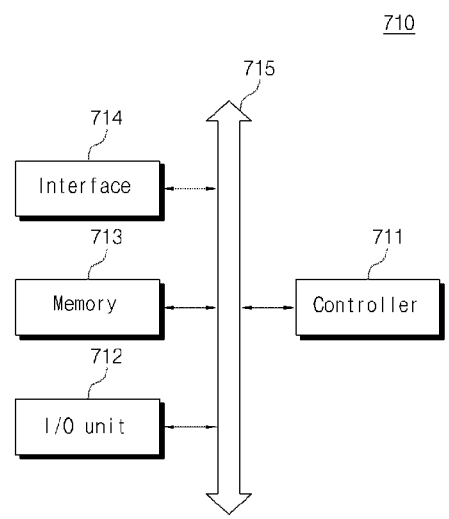
FIG. 9 is a block diagram illustrating a representation of an example of an electronic system including the semiconductor package in accordance with the embodiments.

Referring to FIG. 9, the semiconductor package in accordance with the embodiments may be applied to an electronic system 710. The electronic system 710 may include a controller 711, an input/output unit 712, and a memory 713. The controller 711, the input/output unit 712 and the memory 713 may be electrically coupled with one another through a bus 715 which provides a data movement path.

For example, the controller 711 may include at least one microprocessor, at least one digital signal processor, at least one microcontroller, and at least one of logic circuits capable of performing the same functions as these components. The memory 713 may include at least one among the semiconductor packages in accordance with the embodiments discussed herein. The input/output unit 712 may include at least one selected among a keypad, a keyboard, a display device, a touch screen, and so forth. The memory 713 as a device for storing data may store data or/and commands to be executed by the controller 711 or the like.

The memory 713 may include a volatile memory device such as a DRAM or/and a nonvolatile memory device such as a flash memory. For example, a flash memory may be mounted to an information processing system such as a mobile terminal or a desk top computer. The flash memory may be configured as a solid state drive (SSD). In this case, the electronic system 710 may stably store a large amount of data in a flash memory system.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

In the case where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 10:
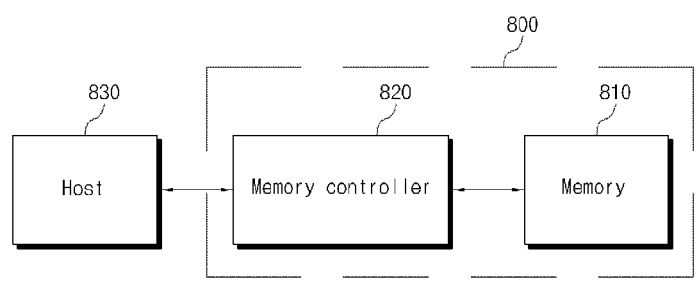
FIG. 10 is a block diagram illustrating a representation of an example of a memory card including the semiconductor package in accordance with the embodiments.

Referring to FIG. 10, the semiconductor package in accordance with the embodiments may be provided in the form of a memory card 800. For example, the memory card 800 may include a memory 810 such a nonvolatile memory device and a memory controller 820. The memory 810 and the memory controller 820 may store data or read stored data.

The memory 810 may include at least any one among nonvolatile memory devices to which the semiconductor package in accordance with the embodiments is applied, and the memory controller 820 may control the memory 810 to read stored data or store data, in response to a read/write request from a host 830.

While various embodiments have been described above, it will be understood to those skilled in the art that the embodiments described are by way of example only. Accordingly, the semiconductor package having an overhang portion described herein should not be limited based on the described embodiments.

What is claimed is:

1. A semiconductor package comprising:
    a substrate;
    a structural body disposed over the substrate;
    a semiconductor chip stacked over the structural body, and having an overhang portion projecting over a side surface of the structural body and overhanging from the side surface of the structural body,
    one or more bonding pads disposed on the overhang portion;
    one or more wires electrically coupling the bonding pads to the substrate;
    a wire fixing film attached onto the structural body, and projecting over the side surface of the structural body and overhanging from the side surface of the structural body to fix the one or more wires, and
    wherein the semiconductor chip and the wire fixing film project over the same side surface of the structural body and overhang from the same side surface of the structural body.

2. The semiconductor package according to claim 1, wherein the wire fixing film and the semiconductor chip are substantially horizontally disposed over the structural body.

3. The semiconductor package according to claim 2, further comprising:
    an adhesive member formed between the structural body and the semiconductor chip to attach the structural body and the semiconductor chip to each other.

4. The semiconductor package according to claim 2, wherein the wire fixing film is formed on two opposing sides of the semiconductor chip.

5. The semiconductor package according to claim 2, wherein the wire fixing film is formed on only one side of the semiconductor chip.

6. The semiconductor package according to claim 1, wherein the wire fixing film is formed to extend between a top surface of the structural body and a bottom surface of the semiconductor chip to attach the structural body and the semiconductor chip to each other.

7. The semiconductor package according to claim 1, wherein the structural body comprises at least any one of a semiconductor chip, a dummy chip and an insulator.

8. The semiconductor package according to claim 1, wherein the wire fixing film comprises:
    a support layer;
    an adhesive layer formed on a bottom surface of the support layer, and configured for attaching the support layer and the structural body to each other; and
    a fixing layer formed on a top surface of the support layer, and configured for fixing the one or more wires.

9. The semiconductor package according to claim 8, wherein the one or more wires are formed such that portions of the one or more wires are buried into the fixing layer.

10. The semiconductor package according to claim 8, wherein the one or more wires are formed such that portions of the one or more wires are seated on the fixing layer.

11. A semiconductor package comprising:
    a substrate;
    a structural body disposed over the substrate;
    a semiconductor chip having a plurality of bonding pads, and stacked over the structural body such that one end portion of the semiconductor chip having one or more bonding pads projects over a side surface of the structural body and overhangs from the side surface of the structural body;
    a wire fixing film attached onto the structural body such that one end portion of the wire fixing film projects over the side surface of the structural body and overhangs from the side surface of the structural body;
    wires electrically coupling the bonding pads and the substrate across the wire fixing film, and fixed to the wire fixing film, and
    wherein the semiconductor chip and the wire fixing film project over the same side surface of the structural body and overhang from the same side surface of the structural body.

12. The semiconductor package according to claim 11, wherein
    wires among the wires, which are electrically coupled with the bonding pads disposed on the one end portion of the semiconductor chip, are fixed to the one end portion of the wire fixing film while extending across the one end portion of the wire fixing film.

13. The semiconductor package according to claim 11, wherein the wire fixing film and the semiconductor chip are substantially horizontally disposed over the structural body.

14. The semiconductor package according to claim 13, further comprising:
    an adhesive member formed between the structural body and the semiconductor chip to attach the structural body and the semiconductor chip to each other.

15. The semiconductor package according to claim 13, wherein the wire fixing film is formed on two opposing sides of the semiconductor chip.

16. The semiconductor package according to claim 13, wherein the wire fixing film is formed on only one side of the semiconductor chip.

17. The semiconductor package according to claim 11, wherein the wire fixing film is formed to extend between a top surface of the structural body and a bottom surface of the semiconductor chip to attach the structural body and the semiconductor chip to each other.

18. The semiconductor package according to claim 11, wherein the structural body comprises at least any one of a semiconductor chip, a dummy chip and an insulator.

19. The semiconductor package according to claim 11, wherein the wire fixing film comprises:
- a support layer;
- an adhesive layer formed on a bottom surface of the support layer, and configured for attaching the support layer and the structural body to each other; and
- a fixing layer formed on a top surface of the support layer, and configured for fixing the wires.

20. The semiconductor package according to claim 19, wherein the wires are formed such that portions of the respective wires are buried into the fixing layer.

21. The semiconductor package according to claim 19, wherein the wires are formed such that portions of the respective wires are seated on the fixing layer.

* * * * *